US011067639B2

(12) United States Patent
Andle et al.

(10) Patent No.: US 11,067,639 B2
(45) Date of Patent: Jul. 20, 2021

(54) TRENDING FUNCTIONS FOR PREDICTING THE HEALTH OF ELECTRIC POWER ASSETS

(71) Applicant: Rosemount Inc., Shakopee, MN (US)

(72) Inventors: Jeffrey C. Andle, Rockledge, FL (US); Thomas M. Cunneen, Beverly, MA (US); David Lane, Beverly, MA (US)

(73) Assignee: ROSEMOUNT INC., Shakopee, MN (US)

( * ) Notice: Subject to any disclaimer, the term of this patent is extended or adjusted under 35 U.S.C. 154(b) by 343 days.

(21) Appl. No.: 16/143,811

(22) Filed: Sep. 27, 2018

(65) Prior Publication Data

US 2019/0137552 A1    May 9, 2019

Related U.S. Application Data

(60) Provisional application No. 62/581,635, filed on Nov. 3, 2017, provisional application No. 62/619,603, filed on Jan. 19, 2018.

(51) Int. Cl.
*G01R 31/50* (2020.01)
*G01R 21/14* (2006.01)
(Continued)

(52) U.S. Cl.
CPC ............ *G01R 31/50* (2020.01); *G01R 21/14* (2013.01); *G06F 17/11* (2013.01); *H02J 3/14* (2013.01);
(Continued)

(58) Field of Classification Search
CPC ........ G01R 31/50; G01R 21/14; G01R 31/62; G01R 31/12; G06F 17/11; H02J 3/14; H02J 3/003; H02J 2203/20; G06Q 50/06
See application file for complete search history.

(56) References Cited

U.S. PATENT DOCUMENTS

| 3,938,034 A | 2/1976 | Japenga |
| 4,904,996 A | 2/1990 | Fernandes |

(Continued)

FOREIGN PATENT DOCUMENTS

| CA | 2 192 856 | 9/2000 |
| CA | 2 455 206 | 5/2012 |

(Continued)

OTHER PUBLICATIONS

Office Action (including translation) from Chinese Application No. 201920428356.3, dated Apr. 10, 2020.
(Continued)

*Primary Examiner* — Arleen M Vazquez
*Assistant Examiner* — Lyudmila Zaykova-Feldman
(74) *Attorney, Agent, or Firm* — Westman, Champlin & Koehler, P.A.

(57) ABSTRACT

A method for determining a dynamic rating for a conductive path includes using a sensor to measure a value for a load parameter and selecting a heating process associated with the load parameter. A rated temperature change is changed by removing temperature changes due to a heating process other than the selected heating process to produce an impaired rated temperature change. A thermal load percentage is determined from the impaired rated temperature change. The thermal load percentage and the measured value are then used to determine the dynamic rating for the load parameter. A method also includes measuring a temperature rise, a current, and a voltage on the conductive path multiple times. Using at least two basis functions and the multiple measured temperature rises, currents and voltages, the values for at least two variables are determined. Trends in each variable are determined to determine a condition of electric equipment.

20 Claims, 7 Drawing Sheets

(51) Int. Cl.

| | |
|---|---|
| G06F 17/11 | (2006.01) |
| H02J 3/14 | (2006.01) |
| H02J 3/00 | (2006.01) |
| G01R 31/62 | (2020.01) |
| G01R 31/12 | (2020.01) |
| G06Q 50/06 | (2012.01) |

(52) U.S. Cl.
CPC .............. *G01R 31/12* (2013.01); *G01R 31/62* (2020.01); *G06Q 50/06* (2013.01); *H02J 3/003* (2020.01); *H02J 2203/20* (2020.01)

(56) References Cited

U.S. PATENT DOCUMENTS

| | | | |
|---|---|---|---|
| 4,937,763 | A | 6/1990 | Mott |
| 5,063,931 | A | 11/1991 | Leavitt |
| 5,341,088 | A * | 8/1994 | Davis .................... G01R 19/15 |
| | | | 324/106 |
| 5,612,930 | A | 3/1997 | Hazony et al. |
| 5,815,352 | A | 9/1998 | Mackenzie |
| 5,933,012 | A | 8/1999 | Bengtsson et al. |
| 6,002,260 | A | 12/1999 | Lau et al. |
| 6,172,862 | B1 | 1/2001 | Jonnatti et al. |
| 6,297,642 | B1 | 10/2001 | Shibahara et al. |
| 6,424,162 | B1 | 7/2002 | Rokunohe et al. |
| 6,483,316 | B2 | 11/2002 | Kato et al. |
| 6,577,138 | B2 | 6/2003 | Zuercher et al. |
| 6,774,639 | B1 | 8/2004 | Unsworth |
| 7,071,701 | B2 | 7/2006 | Roman et al. |
| 7,127,327 | B1 * | 10/2006 | O'Donnell ................ G05F 1/66 |
| | | | 700/286 |
| 7,577,535 | B2 | 8/2009 | Anderson et al. |
| 7,676,333 | B2 | 3/2010 | Younsi et al. |
| 7,912,660 | B2 | 3/2011 | Anderson et al. |
| 8,271,213 | B2 | 9/2012 | Xu et al. |
| 8,466,690 | B2 | 6/2013 | Stewart et al. |
| 8,929,036 | B2 | 1/2015 | Nayak et al. |
| 9,372,221 | B1 | 6/2016 | Bierman |
| 9,733,285 | B2 | 8/2017 | Kennedy et al. |
| 9,753,080 | B2 | 9/2017 | Andle et al. |
| 2003/0093390 | A1 | 5/2003 | Onoda et al. |
| 2005/0035768 | A1 | 2/2005 | Rabach et al. |
| 2005/0194979 | A1 | 9/2005 | Roman et al. |
| 2007/0059986 | A1 | 3/2007 | Rockwell |
| 2007/0272827 | A1 | 11/2007 | Heo et al. |
| 2008/0133154 | A1 | 6/2008 | Krauss |
| 2008/0204950 | A1 | 8/2008 | Zhou et al. |
| 2008/0309351 | A1 | 12/2008 | Steward et al. |
| 2009/0119035 | A1 | 5/2009 | Younsi et al. |
| 2009/0251308 | A1 | 10/2009 | Schweitzer, III et al. |
| 2010/0072355 | A1 | 3/2010 | Schweitzer, III et al. |
| 2010/0114392 | A1 | 5/2010 | Lancaster |
| 2010/0271152 | A1 | 10/2010 | Sabah et al. |
| 2011/0234215 | A1 | 9/2011 | Ausserlechner |
| 2011/0234362 | A1 | 9/2011 | Koehler et al. |
| 2011/0249370 | A1 | 10/2011 | Nayak et al. |
| 2012/0134058 | A1 | 5/2012 | Pamer et al. |
| 2012/0185185 | A1 | 7/2012 | Bae et al. |
| 2013/0192376 | A1 | 8/2013 | Zhou et al. |
| 2013/0234726 | A1 | 9/2013 | Hobelsberger |
| 2014/0270205 | A1 | 9/2014 | Miller |
| 2015/0043310 | A1 | 2/2015 | Maas et al. |
| 2015/0160098 | A1 | 6/2015 | Noda et al. |
| 2015/0253362 | A1 | 9/2015 | Louzir et al. |
| 2015/0260778 | A1 | 9/2015 | Park et al. |
| 2015/0317229 | A1 | 11/2015 | Wade et al. |
| 2016/0209454 | A1 | 7/2016 | McCammon et al. |
| 2016/0209459 | A1 | 7/2016 | Tozzi et al. |
| 2016/0231375 | A1 | 8/2016 | Roemer et al. |
| 2017/0038424 | A1 | 2/2017 | Ikegami et al. |
| 2017/0193252 | A1 | 7/2017 | Ehrhardt et al. |
| 2018/0062003 | A1 | 3/2018 | Luan et al. |
| 2018/0252760 | A1 | 9/2018 | Andle et al. |
| 2018/0356357 | A1 | 12/2018 | Samarao |
| 2019/0250198 | A1 | 8/2019 | Kubena et al. |
| 2020/0274345 | A1 * | 8/2020 | Li ............................ H01B 7/29 |

FOREIGN PATENT DOCUMENTS

| | | |
|---|---|---|
| CA | 2 821 795 | 7/2012 |
| CN | 1407345 | 4/2003 |
| CN | 102193052 | 9/2011 |
| CN | 203025311 | 6/2012 |
| CN | 102621377 | 8/2012 |
| CN | 102934308 | 2/2013 |
| CN | 103913663 | 7/2014 |
| CN | 104914358 | 9/2015 |
| CN | 106199362 | 12/2016 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 24 364 | 5/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 5-107301 | 4/1993 |
| JP | 3082132 | 8/2000 |
| JP | 2002-131366 | 5/2002 |
| JP | 2004-61358 | 2/2004 |
| JP | 2011-095036 | 5/2011 |
| JP | 4840050 | 12/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | WO 2014/189975 | 11/2014 |
| WO | WO 2017/029415 | 2/2017 |

OTHER PUBLICATIONS

Office Action from Chinese Patent Application No. 201880000347.2, dated May 28, 2020 including partial translation.
Notification of Transmittal of the International Search Report and the Written Opinion of the International Searching Authority from PCT/US2018/057461, dated Apr. 18, 2019.
Notification of Transmittal of the International Search Report and the Written Opinion of the International Searching Authority from PCT/US2019/018392, dated Jun. 3, 2019.
"Partial Discharge Theory and Applicants to Electrical Systems", by G. Paoletti et al., IEEE IAS Pulp and Paper Industry Conference in Seattle, WA, 1999.
"Advantages of Continuous Monitoring of Partial Discharges in Rotating Equipment and Switchgear", by C. Kane et al., 8 pgs.
"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andle et al., IEEE, 2015.
Oil, Gas, and Petrochemicals Users Group Meeting, 2012, 2 pgs.
Notification of Transmittal of the International Search Report and the Written Opinion of the International Searching Authority from PCT/US2018/020585, dated Jun. 25, 2018.

(56) References Cited

OTHER PUBLICATIONS

"Ubiquitous, On-Line, Partial Discharge Trending", by J. Andle et al., Electrical Insulation Conference (EIC) San Antonio, TX, Jun. 2018, IEEE, 6 pgs.
"Using Continuous Temperature Monitoring to Avoid Critical Asset Failure" by J. Andle et al., Electric Light & Power, 2015, 7 pgs.
"Partial Discharge Testing: A Progress Report" by V. Warren, PD Progress Report, IRMC 2013, 11 pgs.
"Ameren Illinois Smart Grid Test Bed Evaluation", by B. Snyder et al., Quanta Technology, LLC, 2017, 30 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electrothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al, Electrical Insulation Conference and Electrical Manufacturing & Coil Winding Conference, Oct. 1999.
Office Action from U.S. Appl. No. 14/961,321 dated Jan. 10, 2017.
Office Action from Chinese Patent Application No. 201920428356. 3, dated Nov. 7, 2019.
Notification of Transmittal of the International Search Report and the Written Opinion of the International Searching Authority from International Application No. PCT/US2019/053726, dated Dec. 17, 2019.
Notification of Transmittal of the International Search Report and the Written Opinion of the International Searching Authority from International Application No. PCT/US2019/027669, dated Jul. 23, 2019.
Communication from European Patent Application No. 18712051. 4, dated Sep. 18, 2019.
Office Action from U.S. Appl. No. 16/227,478, dated Feb. 5, 2020.

\* cited by examiner

TRENDING FUNCTIONS FOR PREDICTING THE HEALTH OF ELECTRIC POWER ASSETS

CROSS-REFERENCE TO RELATED APPLICATION

The present application is based on and claims the benefit of U.S. provisional patent application Ser. No. 62/581,635, filed Nov. 3, 2017, and is also based on and claims the benefit of U.S. provisional patent application Ser. No. 62/619,603, filed Jan. 9, 2018, the contents of which are hereby incorporated by reference in their entirety.

BACKGROUND

A dominant cost in systems that generate, transmit and distribute electrical power is an interruption in the power provided to customers and the ensuing loss of dependent business operations. Single outages of critical assets have cost hundreds of millions of dollars in lost revenue in addition to the cost of the equipment repairs.

To avoid such failures, system operators limit the loads placed on the various assets to remain below the nominal load ratings for those assets. In addition, operators establish fixed intervals for inspecting the various assets and set fixed replacement dates for replacing some assets regardless of the health of those assets.

The nominal load ratings for an asset assumes that the asset is operating properly. However, if the asset is experiencing a partial failure of some sort, the safe load rating for the asset may be lower than the nominal load rating. Further, setting fixed intervals for inspection and replacement wastes labor because many assets are in acceptable condition and do not require replacement at the time of inspection/replacement. In addition, other assets continue to fail between the inspection/replacement intervals resulting in an outage and the attendant lost revenues.

The discussion above is merely provided for general background information and is not intended to be used as an aid in determining the scope of the claimed subject matter. The claimed subject matter is not limited to implementations that solve any or all disadvantages noted in the background.

SUMMARY

A method for determining a dynamic rating for a load parameter along a conductive path includes using a sensor to measure a value for the load parameter and selecting a heating process associated with the load parameter. A rated temperature rise for the conductive path is modified by removing temperature changes due to a heating process other than the selected heating process to produce an impaired rated temperature change. A thermal load percentage is determined as a ratio of a temperature change due to the selected heating process over the impaired rated temperature change. The thermal load percentage and the measured value for the load parameter are then used to dynamically determine the dynamic rating for the load parameter.

In accordance with a second embodiment, a method includes for each time point in a set of multiple time points: measuring a temperature rise on a conductive path; measuring a current on the conductive path; and measuring a voltage on the conductive path. Using at least two basis functions and the multiple measured temperature rises, currents and voltages, the values for at least two variables are determined, wherein each variable comprises a weight for a respective one of the at least two basis functions. Trends in each variable are determined over time and the trends in at least one of the at least two variables are used to determine a condition of electric equipment.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION OF ILLUSTRATIVE EMBODIMENT

Figure 1:
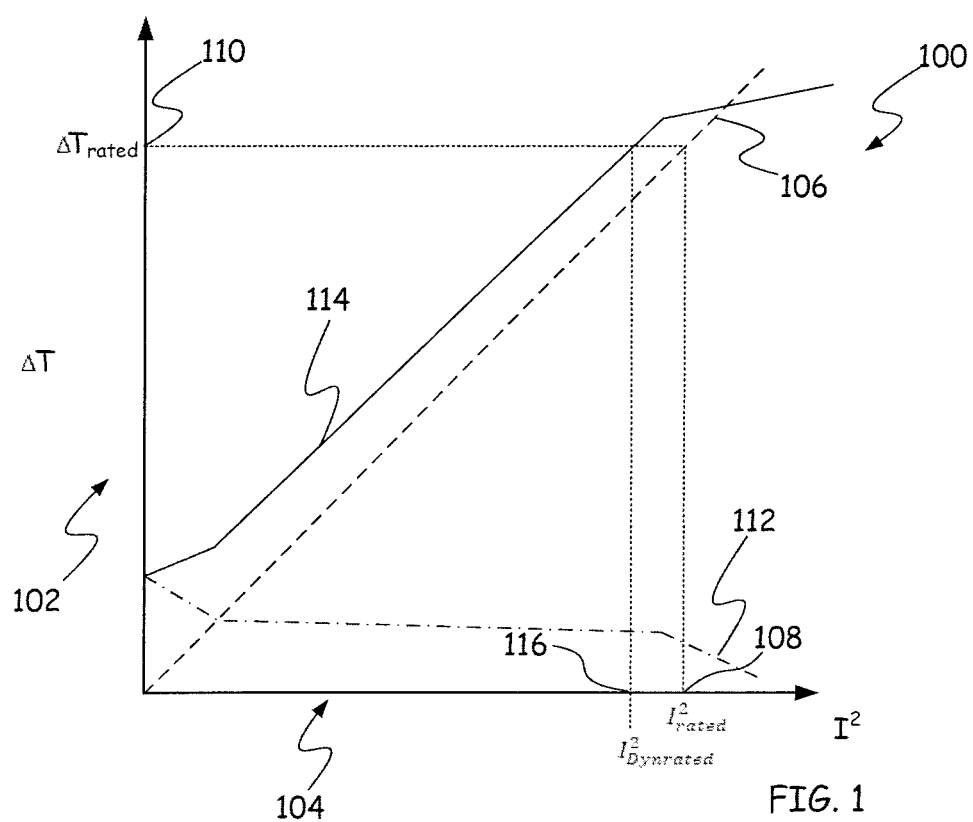
FIG. 1 provides graphs of the effects of other heating processes on the relationship between the rated $\Delta T$ and the rated current.

There is an ongoing need in the generation, transmission, distribution, and end use of electric power for concise, automated, and reliable methods of predicting the instantaneous ratings, health, and remaining life of electric power assets. For stationary assets, such as potential transformers, bus ducts, cables, switchgear, and transformers, the three leading causes of failure are conductor failure (excessive temperature), condensation-induced flashover (excessive humidity), and insulation failure (partial discharge damage). A comprehensive asset monitor is needed that is able to consider all of these factors, provide prognostic and predictive outputs, and provide guidance on the dynamic load rating of various assets.

Electrical assets have multiple different ratings that set a legal limit to how they may be operated safely. These ratings include load ratings for load parameters such as current, voltage, power and temperature. Thus, the ratings set maximum current and voltage magnitudes for the asset and a maximum allowed temperature rise, $\Delta T_{rated}$, and a maximum asset temperature, $T_{c:rated}$. It is assumed that the asset is normally at the same temperature as the environment it is placed in and as such, it should normally be at the same temperature as the ambient temperature of the environment, $T_A$. As a result, the temperature rise, $\Delta T$, is defined as: $\Delta T = T_C - T_A$, where $T_C$ is the temperature of the electric asset/conductive path. Regardless of which temperature rating is specified in a specific standard, the other quantity may be obtained by knowledge of the ambient temperature, $T_A$. By continually measuring the instantaneous temperature of an asset, it is possible to determine if the asset's temperature is approaching one of the ratings. By setting an alarm limit at a temperature that is below the ratings limits but above the normal operating temperature of the asset, it is possible to receive an alarm when an asset begins to fail but before an asset has completely failed. However, by the time an alarm is attained, the equipment may already be damaged. While repair costs will be significantly lower with proactive alarms than with a "run until failure" scenario, it is preferable to predict the problem even earlier, before it has caused damage that requires replacement of significant components with potentially long lead times.

Temperature rise occurs as a balance of heat gain by dissipated power and heat loss by various cooling paths. The net heat flow and heat capacity of the object determine the temperature of the object. There are several significant heat sources. The most significant of these is the resistive (ohmic) loss due to the load current flowing through the conductive elements of the asset. Equation 1 provides the heat gain over a period of time due to current with Ohmic losses:

$$dQi = C^* <r>^* r(I, \ldots) \qquad \text{EQ. 1}$$

where $dQ_i$ is the increase in heat per unit mass of the asset due to resistive loss with a load current I applied to the asset over a period of time, C is the heat capacity of the asset, $r(I, \ldots)$ is a function of at least I where the ellipsis denotes other measured values of the asset that can be used in the function, and $<r>$ is a magnitude of function $r(I, \ldots)$.

Examples of $r(I, \ldots)$ include:

$$r(I, \ldots) = I^2 * R \qquad \text{EQ. 2}$$

and $$r(I, \ldots) = I^2 * R_o * (1 + \alpha \Delta T) \qquad \text{EQ. 3}$$

where I is the current through the asset, R is a fixed resistance of the asset, $R_o$ is the resistance of the asset at ambient temperature $T_A$, $\Delta T$ is the temperature rise of the asset above the ambient temperature and $\alpha$ is the temperature coefficient of resistance for the asset. In Equation 2, it is assumed that the resistance does not change significantly with the temperature rise and in Equation 3, the function accounts for resistance changes due to the temperature rise. In both examples, the function is non-linear with respect to the load current but linear with respect to the square of the load current.

A second source of heat on an electrical asset is conductive losses in the insulator. These are, by design and construction, negligible until near the end of life for an asset. Heat flow into the system from insulation current leakage (conductive insulation faults other than partial discharge) is defined as:

$$dQ_v \approx C^* <g>^* g(V, \ldots) \qquad \text{EQ. 4}$$

where $dQ_v$ is the increase in heat per unit mass of the asset due to conductive losses through an insulator on the asset, V is the voltage across the insulator, which in some embodiments is taken as the load voltage on the asset, C is the heat capacity of the asset, $g(V, \ldots)$ is a function of at least V where the ellipsis denotes other measured values of the asset that can be used in the function, and $<g>$ is a magnitude of function $g(V, \ldots)$.

Examples of $g(V, \ldots)$ include:

$$g(V, \ldots) = V^2 * G \qquad \text{EQ. 5}$$

and $$g(V, \ldots) = V^2 * G_o * (1 + G' \Delta T + G'' H) \qquad \text{EQ. 6}$$

where V is the voltage across the insulator, which in some embodiments is taken as the load voltage on the asset, G is a fixed conductance of the insulator, $G_0$ is the conductance of the insulator at the ambient temperature, $T_A$, H is the humidity around the insulator, $\Delta T$ is the temperature rise, G' is the temperature coefficient of the conductance and G'' is the humidity coefficient of the conductance. In Equation 5, it is assumed that the conductance does not change significantly with the temperature rise or humidity and in Equation 6, the function accounts for conductance changes due to the temperature rise and humidity. In both examples, the function is non-linear with respect to the load voltage and linear with respect to the square of the voltage.

Alternatively, the conductive losses may be semi-conductive with an activation potential or some other dependence of G on the voltage. An example is the carbonization of some plastics at the terminal stages of partial discharge failure. Another example is pollution on the surface of insulators (salt/dust and humidity).

Heat input due to insulator conduction losses is independent of load current, other than the operational relationship between load current and line voltage and temperature dependence of conductance, which may be related to $I^2$. Because of upstream series resistance, line voltage may be largest at zero load current since the unloaded voltage may be the highest operating case. This can cause an apparent inverse relationship between this heat source and load current.

The third source of heat on an electrical asset relates to the equivalent currents along or through the insulation due to partial discharge activity. Partial discharges are the sudden release of charge, above an inception voltage, at a defect that does not completely bridge the insulation.

$$dQ_p \approx C^* <p>^* p(V, \ldots) \qquad \text{EQ. 7}$$

where $dQ_p$ is the increase in heat per unit mass of the asset due to partial discharges, V is the voltage load on the asset, C is the heat capacity of the asset, $p(V \ldots)$ is a function of at least V where the ellipsis denotes other measured values of the asset that can be used in the function, and $<p>$ is a magnitude of function $p(V, \ldots)$.

Under normal conditions, partial discharge activity is negligible below an inception voltage, $V_i$. By design and construction, the inception voltage is above the normal operating conditions. Transients such as common mode voltage surges may cause partial discharge from line to earth, even though the differential line-to-line voltages do not exceed the inception voltage. Differential transients may temporarily take the voltage above inception. Mechanical damage, particulates, and condensation may lower the inception voltage. In most cases the partial discharge currents are a nonlinear function that is zero for $|V| < |V_i|$ and nonlinear otherwise. As a result, the function is denoted as $p(V, <V_i>, \ldots)$ where $V_i$ is a current value for the inception voltage.

There may be zero, one, or many discharges. Each discharge will have a charge transfer, $q_n$, and the net current flow is the sum of the charges in each discharge in a power cycle times the line frequency. Therefore, partial discharge will conduct an equivalent current, $$I_{PD} = f \Sigma_{n=1 \text{ to } N} q_n \qquad \text{EQ. 8}$$

where $I_{PD}$ is the current due to partial discharge, f is the line frequency, N is the number of individual partial discharge events per power cycle, and $q_n$ is the charge conducted in partial discharge event n. Using this model, examples of $p(V, <V_i>, \ldots)$ include:

$$p(V_i, <V_i>, \ldots) = V^* f \Sigma_{n=1 \text{ to } N} q_n \quad \text{EQ. 9}$$

and $$p(V<V_i>, \ldots) = f \Sigma_{n=1 \text{ to } N} q_n V_n \quad \text{EQ. 10}$$

where $V_n$ is the instantaneous load voltage corresponding to partial discharge n. However, discharges tend to occur near the peaks of the sine wave, so knowledge of the details are not necessary. In many measurement systems, only the maximum discharge is recorded and in others, only an aggregate partial discharge activity is known.

In other embodiments, an aggregate input may be obtained from another system that measures partial discharge (PD) and corona (SD) intensity, such that the basis function is proportional to the external measurement:

$$p(V, PD, SD, \ldots) = (\{f\}^* PD^{\{g\}} + \{h\}^* SD^{\{i\}}) V \quad \text{EQ. 11}$$

where SD and PD are corona discharge and partial discharge intensity measurements, as might be obtained from a method such as U.S. Pat. No. 9,753,080, which is hereby incorporated by reference and $\{f\}-\{i\}$ are model parameters.

Alternately, the inception voltage$<V_i>$, the charge per partial discharge$<Q_{iec}>$, and the number of partial discharges per cycle$<N_{iec}>$ may be obtained from an external monitoring system and $p(V, <Q_{iec}>, <N_{iec}>, \ldots)$ may be estimated as:

$$p(V_i, <Q_{iec}>, <N_{iec}>, \ldots) = fV<Q_{iec}><N_{iec}> \quad \text{EQ. 12}$$

Heat input due to local partial discharge is independent of load current and may even be largest at zero load current since the voltage is typically at its peak with no load.

In addition to heat being generated by power dissipation, heat is lost to the ambient environment through conduction, convection and radiation. It is generally assumed that the ambient temperature, $T_A$, is not increased by the local heating; however, in many compact assets this is not true and both $\Delta T$ and $T_A$ need to be included in the basis functions. Conductive and convective cooling are proportional to the temperature rise, $\Delta T$. The temperature rise is, in turn, determined by the net balance of heat increase divided by the thermal capacity of the asset.

Conductive and convective cooling may be accounted for as:

$$dQ_c \approx c^* C^* \Delta T \quad \text{EQ. 13}$$

where $dQ_c$ is the conductive and convective heat loss per unit mass of the asset, $\Delta T$ is the heat rise of the asset and implicitly accounts for any rise in ambient temperature due to the asset, c is a proportionality constant and C is the heat capacity of the asset.

Radiative cooling, which provides the infrared energy used by some thermal sensing systems to measure temperature, is not linear. The energy radiated from an object is proportional to the absolute object temperature raised to the $4^{th}$ power and the energy absorbed from the thermal background is the absolute ambient temperature to the $4^{th}$ power.

$$dQ_r \approx k\ C(T^4 - T_A^4) = k\ C(T^2 - T_A^2)(T^2 + T_A^2) \approx k\ C(\Delta T + 2T_A)((\Delta T + T_A)^2 + T_A^2)\Delta T \quad \text{EQ. 14}$$

$$dQ_r \approx k\ C\Delta T(T_A^3)(2 + 5(\Delta T/T_A) + 4(\Delta T/T_A)^2 + (\Delta T/T_A)^3) \quad \text{EQ. 15}$$

where $dQ_r$ is the radiative heat loss per unit mass of the asset, k is a proportionality constant, and the remaining values are the same as discussed above.

Since the nominal ambient temperature is 300K and higher and the temperature rise is limited by the standards to less than 100K, the linear approximation is a workable, but inaccurate representation. In most cases only a quadratic term need be added for good accuracy at the higher $\Delta T$, although higher order terms are considered in the present invention.

$$dQ_r \approx [(2k\ C\ T_A^3) + (5k\ C\ T_A^2)\Delta T]\Delta T \quad \text{EQ. 16}$$

The net change in heat of the asset, dQ, can be used to determine the temperature change of the asset as $\Delta T = dQ/C$. Different embodiments use different combinations of heat gain and heat loss to determine the net change in heat and thus the temperature change of the asset. Below are various exemplary embodiments of the net heat determination and corresponding temperature change of the asset:

Embodiment 1:

$$dQ \approx dQ_i + dQ_v \quad \text{EQ. 17}$$

$$\Delta T \approx <r> r(I, \ldots) + <g> g(V, \ldots) \quad \text{EQ. 18}$$

Embodiment 2:

$$dQ \approx dQ_i + dQ_P \quad \text{EQ. 19}$$

$$\Delta T \approx <r> r(I, \ldots) + <p> p(V, \ldots) \quad \text{EQ. 20}$$

Embodiment 3:

$$dQ \approx dQ_i + dQ_v + dQ_P \quad \text{EQ. 21}$$

$$\Delta T \approx <r> r(I, \ldots) + <g> g(V, \ldots) + <p> p(V, \ldots) \quad \text{EQ. 22}$$

Embodiment 4:

$$dQ = dQ_i + dQ_v + dQ_P - dQ_r - dQ_c \quad \text{EQ. 23}$$

$$\Delta T = <r> r(I, \ldots) + <g> g(V, \ldots) + <p> p(V, \ldots) - c\Delta T - ((2kT_A^3)(1 + 5/2)(\Delta T/T_A))\Delta T \quad \text{EQ. 24}$$

$$((1 + c + 2kT_A^3(1 + 5/2)(\Delta T/T_A))\Delta T = <r> r(I, \ldots) + <g> g(V, \ldots) + <p> p(V, V_i, \ldots) \quad \text{EQ. 25}$$

$$\Delta T = \frac{<r> r(I, \ldots) + <g> g(V, \ldots) + <p> p(V, V_i, \ldots)}{((1 + c + 2kT_A^3(1 + 5/2)(\Delta T/T_A))} \quad \text{EQ. 26}$$

where the denominator on the right side of Equation 26 can be incorporated into the basis functions $r(I, \ldots)$, $g(V, \ldots)$ and $p(V, V_i, \ldots)$ to produce:

$$\Delta T = <r> r(I, \ldots) + <g> g(V, \ldots) + <p> p(V, <V_i>, \ldots) \quad \text{EQ. 27}$$

where the basis functions all implicitly include a nonlinearity term exemplified by $1/(1 + c + 2\ k\ T_A^3\ (1 + 5/2)\ (\Delta T/T_A))$ or, more simply, $1/(\{a\} + \{b\}\ \Delta T/T_A)$, where terms $\{a\}$ and $\{b\}$ are model parameters that have an optional dependence on $T_A$.

For example, one form of the basis function $r(I, \ldots)$ that allows for inclusion of the radiative cooling nonlinearity is:

$$r(I, \Delta T, \ldots) = I^2/(\{a\} + \{b\}\Delta T/T_A) \quad \text{EQ. 28}$$

In another embodiment, the basis function $r(I, \ldots)$ takes a form that allows for inclusion of the radiative cooling nonlinearity and temperature-dependent resistance:

$$r(I, T_A, \Delta T, \ldots) = I^2(1 + \{c\}(T_A + \Delta T))/(\{a\} + \{b\}\Delta T/T_A) \quad \text{EQ. 29}$$

The same teams may be applied to the conductance and partial discharge basis functions. In one embodiment, the basis function $g(V, \ldots)$ takes the fault of:

$$g(V, H, T_A, \Delta T, \ldots) = V^2(1 + \{d\}H)(1 + \{e\}(T_A + \Delta T))/(\{a\} + \{b\}\Delta T/T_A) \quad \text{EQ. 30}$$

In one embodiment, the basis function p(V, ... ) takes the form of:

$$p(V, T_A, \Delta T, \ldots) = (a*PD^c + b*SD^d)V/(e + f\Delta T/T_A) \qquad \text{EQ. 31}$$

Various embodiments use the basis functions and the relationships between the basis functions and the change in temperature of the asset, ΔT, to improve the operation of an electrical system by dynamically adjusting a load rating for the electrical system to prevent damage to the system and/or by identifying trends in the magnitudes of the basis functions that indicate that an electrical asset is in danger of failing.

In particular, by describing the temperature change as a sum of basis functions, the present inventors have been able to separate temperature changes that are due to a chosen load parameter from temperature changes that are due to other factors. By separating these temperature changes, the present inventors are able to identify a more accurate limit on the temperature change that should be allowed due to the chosen load parameter. Often this more accurate limit is associated with a lower value for the load parameter than the rating for the load parameter. By dynamically selecting this more accurate limit as a dynamic rating for the load parameter, the various embodiments improve the safety of the electrical system by reducing the chances of fire or other destructive events from occurring.

For example, FIG. 1 shows graphs 100 of temperature change of an asset as a function of the square of the load current with the temperature change shown on vertical axis 102 and the square of the current shown on horizontal axis 104. Assuming a linear relationship 106 between the square of the current and the temperature change, a maximum rated temperature change 110, $\Delta T_{rated}$ will have an associated current rating 108, $I_{rated}$. However, this relationship assumes that the only process adding heat to the asset is an ohmic heating process. The present inventors have recognized that this assumption does not always hold, especially as an asset begins to fail. Instead, other heating processes that are weakly tied to or independent of the load current result in additional changes in temperature, shown by graph 112, that are non-linear and/or constant with the square of the load current. By recognizing that the change in temperature of the asset is a combination of the temperature changes due to ohmic heating and other heating processes such as partial discharge and insulator conduction, the present inventors have discovered that the true relationship between the square of the current and the change in temperature is more like graph 114, which intercepts the rated temperature change 110 at a smaller current 116. Thus, due to degrading performance of the asset, the maximum current at which the asset can be operated is reduced to current 116. As discussed below, the present inventors are able to identify what this smaller current is and are further able to dynamically set this smaller current as a dynamic current rating for the asset.

Figure 2:
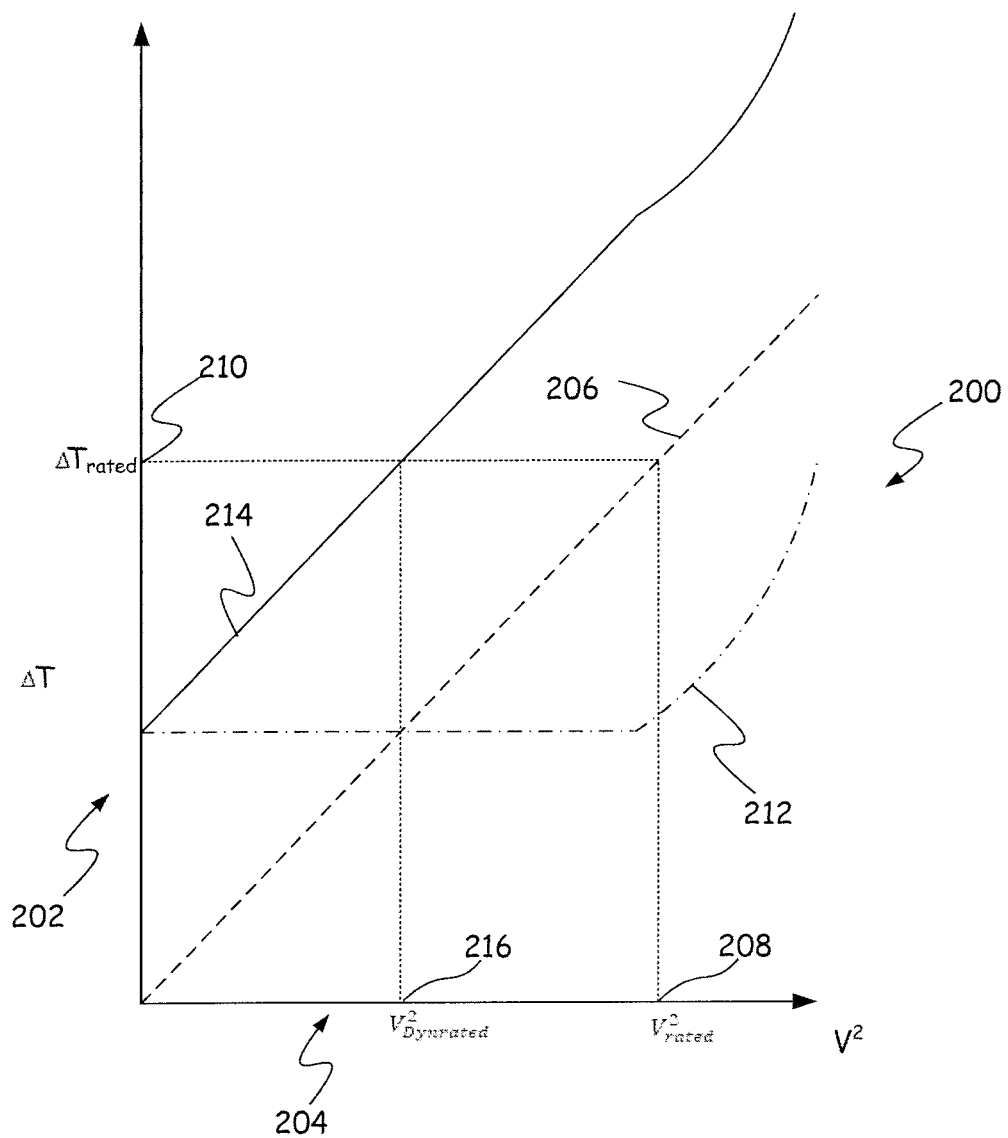
FIG. 2 provides graphs of the effects of other heating processes on the relationship between the rated $\Delta T$ and the rated voltage.

FIG. 2 shows graphs 200 of temperature change of an asset as a function of the square of the load voltage across an insulator with the temperature change shown on vertical axis 202 and the square of the voltage shown on horizontal axis 204. Assuming a linear relationship 206 between the square of the voltage and the temperature change, a maximum rated temperature change 210, $\Delta T_{rated}$ will have an associated voltage rating 208, $I_{rated}$. However, this relationship assumes that contributions to the heat of the asset only come from an insulator conduction process that is a function of the square of the voltage, which is not true. Ohmic heating due to current in the asset is a primary source of heat in most assets and such ohmic heating is not a function of the voltage across the insulator. Additionally, partial discharge heating has a non-linear relationship to the square of the voltage on the asset. Thus, the heat from processes other than insulator conduction can be represented by a non-linear graph 212. This causes the true relationship between the square of the voltage and the change in temperature to be more like graph 214, which intercepts the rated temperature change 210 at a smaller voltage 216. Thus, the maximum voltage at which the asset can be operated is reduced to voltage 216. As discussed below, the present inventors are able to identify what this smaller voltage is and are further able to dynamically set this smaller voltage as a dynamic voltage rating for the asset.

Figure 3:
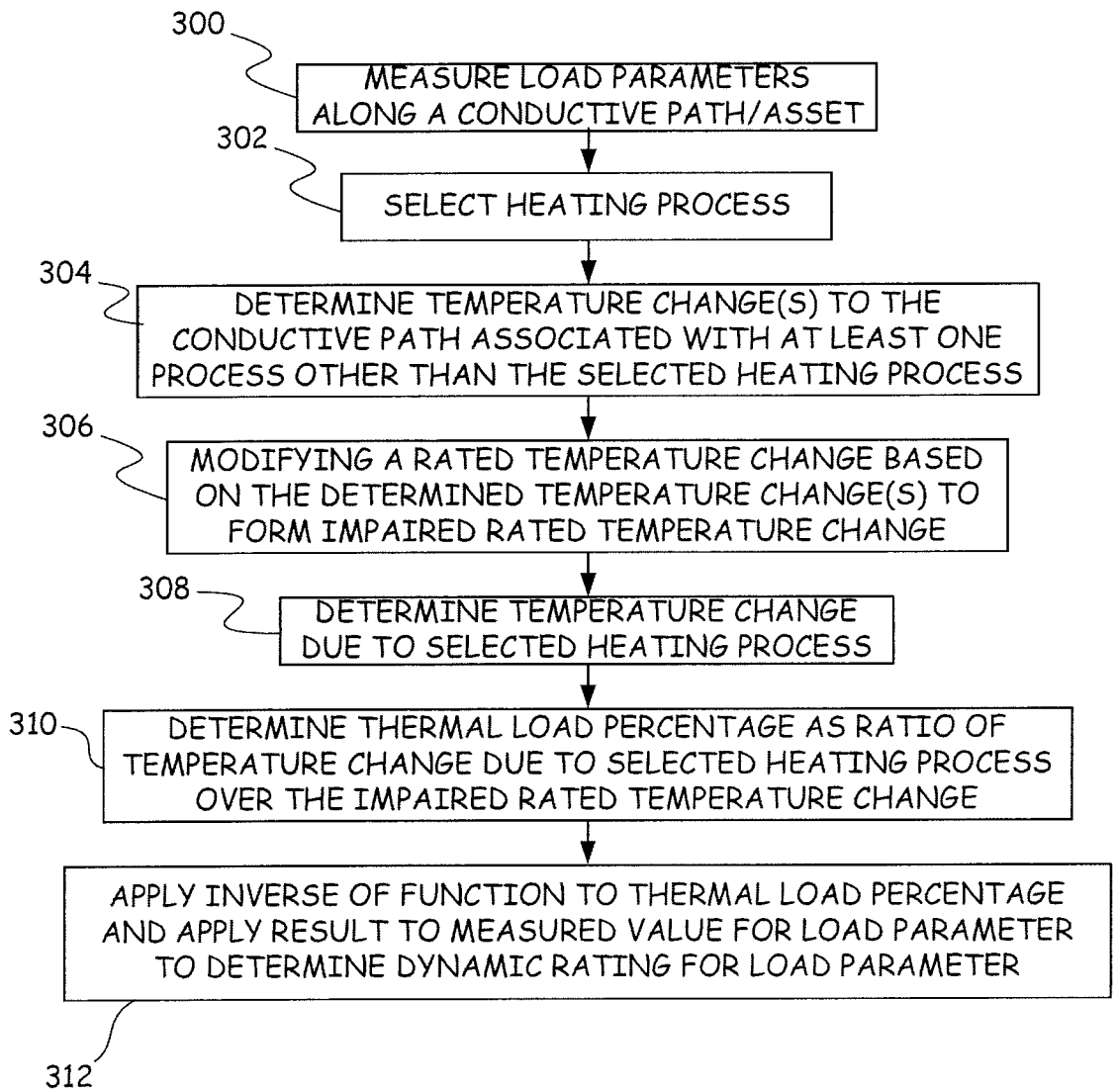
FIG. 3 provides a flow diagram of a method of determining a dynamic load rating for an electric asset.
Figure 4:
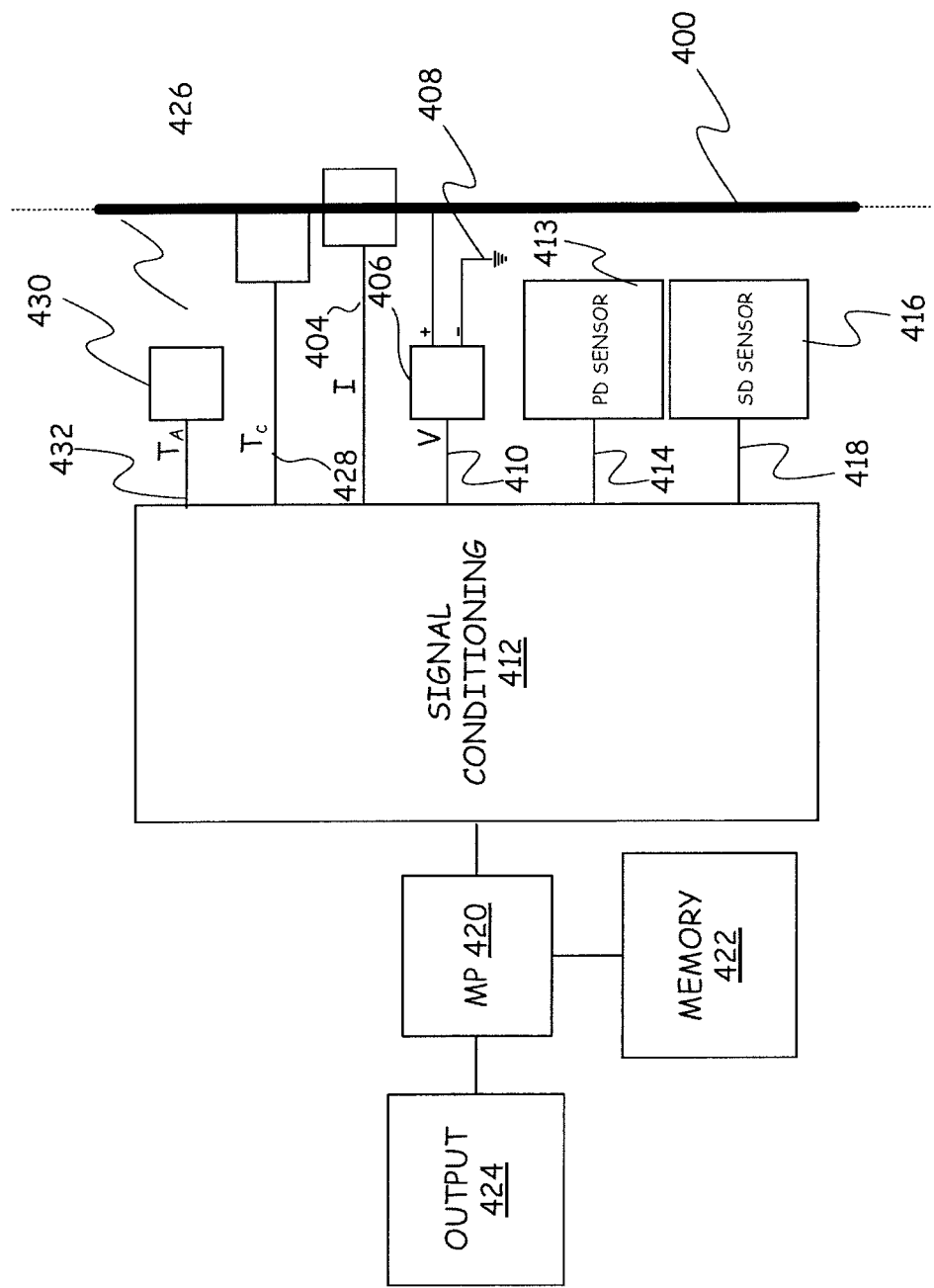
FIG. 4 provides a block diagram of a system for determining a dynamic load rating for an electric asset and for identifying and trending state variables to determine the health of an electric asset.

FIG. 3 provides a method for determining a dynamic rating for a conductive path/electric asset and FIG. 4 provides a block diagram of a system for setting such a dynamic rating. In step 300, parameters along a conductive path/electric asset 400 are measured. These parameters include the load parameter that is to have its dynamic rating set such as the load current on the conductive path/electric asset 400 or the load voltage across an insulator of the conductive path/electric asset 400. The load current is measured using a current sensor 402 which produces a current magnitude 404. The current magnitude can be a peak-to-peak magnitude or a RMS magnitude. In one embodiment, the load voltage is measured using a voltage sensor 406 that measures the voltage between the conductive path/electric asset 400 and ground 408 to produce a voltage magnitude 410. Additional measured parameters can include partial discharges, which are detected by sensor 413 such as a VHF/UHF antenna, capacitive contact, contact, or a high-frequency current transformer configured to receive radio frequency emissions or an acoustic sensor, ultrasonic audio sensor, or optical detector. Sensor 413 produces partial discharge values 414 such as charge per discharge and number of discharges per cycle. Additionally, a corona discharge sensor 416, such as an optical sensor that detects ultraviolet light, senses corona discharges and in response produces corona discharge values 418.

Sensor outputs 404, 410, 414 and 418 are provided to signal conditioning module 412, which converts the sensor outputs to digital values if necessary and performs any filtering or amplification needed to isolate the sensor output from various noise sources. In some embodiments, signal conditioning 412 decimates the sensor outputs to reduce the amount of data that is processed. Signal conditioning 412 then provides digital sensor values for the various parameters of conductive path/electric asset 400 to microprocessor 420.

Signal conditioning 412 also receives ambient temperature values 432, TA, from an ambient temperature sensor 430 and conductive path temperature values 428, TC, from a conductive path/electric asset temperature sensor 426. Ambient temperature sensor 430 measures the temperature of the air around conductive path/electric asset 400 and temperature sensor 426 measures the temperature of conductive path/electric asset 400. Signal conditioning module 412 converts temperature values 432 and 434 into digital values if necessary and performs any filtering or amplification needed to isolate the temperature values from noise. In some embodiments, signal conditioning 412 decimates temperature values 432 and 434 to reduce the amount of data that is processed.

At step 302, microprocessor 420 selects a heating process for which a dynamic rating is to be set. One example of such a process is an ohmic heating process that is based on the current passing though conductive path/electric asset 400 and for which a dynamic rating for the load current is set. Another example of such a process is an insulator conduction heating process that is based on current passing through the insulator and for which a dynamic rating for the load voltage is set. The microprocessor may alternate between calculating multiple dynamic ratings in alternating calculations.

At step 304, microprocessor 420 uses the measured sensor values to determine a temperature change of conductive path/electric asset 400 due to at least one heating process other than the heating process selected at step 302. For example, if ohmic heating was selected in step 302, any of the following temperature changes can be determined at step 304:

$$\Delta T_{other} = <g>g(V, \ldots)$$ EQ. 32

$$\Delta T_{other} = <p>p(V, \ldots)$$ EQ. 33

Or $$\Delta T_{other} = <g>g(V, \ldots) + <p>p(V, \ldots)$$ EQ. 34

Alternatively, if insulator conduction heating was selected at step 302, any of the following temperatures changes can be determined at step 304, for example:

$$\Delta T_{other} = <r>r(I, \ldots)$$ EQ. 35

Or $$\Delta T_{other} = <r>r(I, \ldots) + <p>p(V, <V_i> \ldots)$$ EQ. 36

At step 306, a temperature change rating for conductive path/electric asset 400 is altered by subtracting the temperature changes due to the one or more heating processes determined at step 304. Thus, the temperature change calculated using one of equations 32-36 is subtracted from the temperature rating to produce an impaired temperature rating:

$$\Delta T_{impaired} = \Delta T_{rated} - \Delta T_{other}$$ EQ. 37

At step 308, the temperature change due to the selected heating process is determined. In accordance with one embodiment, step 308 involves subtracting the temperature change due to the at least one other heating processes (any of Equations 32-36, for example) from a measured temperature change, where the measured temperature change is determined as a difference between the temperature 428, $T_C$, of the conductive path 400 measured by temperature sensor 426 and the ambient temperature 432, $T_A$, of the air around conductive path 400 measured by temperature sensor 430.

$$\Delta T_{process} = \Delta T_{meas} - \Delta T_{other} = T_C - T_A - \Delta T_{other}$$ EQ. 38

In other embodiments, the ambient temperature, $T_A$, is determined by taking a plurality of temperature measurements along at least one conductive path under different load conditions and taking the lowest measured temperature of the plurality of temperature measurements as the measured ambient temperature, $T_A$.

In other embodiments, the temperature change due to the selected heating process is calculated directly using the basis function for the heating process. For example, if ohmic heating is selected at step 302, Equation 35 is used to determine the temperature change due to the current in the conductors of asset 400:

$$\Delta T_{process} = <r>r(I, \ldots)$$ EQ. 39 and if insulator conduction heating is selected at step 302, Equation 32 is used to determine the temperature change due to current conducted by the insulator:

$$\Delta T_{process} <g>g(V, \ldots)$$ EQ. 40

At step 310, microprocessor 420 determines a thermal load percentage by dividing the temperature change due to the selected heating process by the impaired temperature rating:

$$\% \text{Load}_{thermal} = \Delta T_{process} / \Delta T_{impaired}$$ EQ. 41

At step 312, the inverse of the selected heating process's relationship to the load current or load voltage is applied to the % $\text{Load}_{thermal}$. This relationship is set by the basis function for the selected heating process. For example, for an ohmic heating process, the relationship between the load current and temperature change is set in r<I, ...> and for an insulator conduction process, the relationship between the load voltage and the temperature change is set in g<V, ...>. Thus, if r<I, ...> is proportional to $I^2$, then the inverse of this relationship is a square-root and step 312 involves applying a square-root to % $\text{Load}_{thermal}$. If the relationship is exponential then the inverse would be logarithmic. In some cases, an inverse may need to be estimated by iterative numerical methods.

The result of the inverse operation is then multiplied by the measured value of the load current (when the ohmic heating process is selected) or the load voltage (when the insulator conduction heating process is selected) to produce the dynamic rating. For example, for a squared relationship between the load current and the temperature change when the ohmic heating process was selected, the dynamic rating for the load current becomes:

$$I_{dyn.rated} = \min(I_{rated}, I_{meas} * \sqrt{\%\text{Load}_{thermal}})$$ EQ. 42 where $I_{dyn.rated}$ is the dynamic rating for the load current, which becomes the minimum of the listed rating for the current, $I_{rated}$, for the conductive path/asset 400 and the product of the measured value of the load current, $I_{meas}$, and the square root of the % $\text{Load}_{thermal}$.

Similarly, for a squared relationship between the load voltage and the temperature change when the insulator conduction heating process was selected, the dynamic rating for the load voltage becomes:

$$V_{dyn.rated} = \min(V_{rated}, V_{meas} * \sqrt{\%\text{Load}_{thermal}})$$ EQ. 43

In some embodiments, the dynamic rating for the voltage may be further limited to be below the inception voltage $V_i$ determined by either external measurements or by fitting $V_i$ and a magnitude in p(V, Vi, ... ):

$$V_{dyn.rated} = \min(V_{rated}, V_i, V_{meas} * \sqrt{\%\text{Load}_{thermal}})$$ EQ. 44

After the dynamic rating has been determined at step 312, microprocessor 420 can store the dynamic rating in memory 422 and use the rating to determine when to issue alerts indicating that a load on conductive path/asset 400 has exceeded a dynamic rating. Alternatively, or additionally, microprocessor 420 can transmit the dynamic rating through an output channel 424 to one or more controllers or other systems that use the dynamic rating to adjust the load applied to the asset so that it remains below the dynamic rating or to trigger maintenance of the asset when the load exceeds the dynamic rating.

The process of FIG. 3 can be repeated on a periodic basis or whenever a heating process such as insulator conduction or partial discharge is determined to be increasing.

In accordance with a further embodiment, a relationship between the measured temperature change and multiple different basis functions, such as any of the relationships shown in equations 18, 20, 22, and 26/27 above, for example, is used to determine a trend in one or more state variables. Specifically, the relationships are used to determine trends in the weights such as <r>, <g>, and <p>. These trends in turn are used to determine the health of a conductive path/electric asset.

Figure 5:
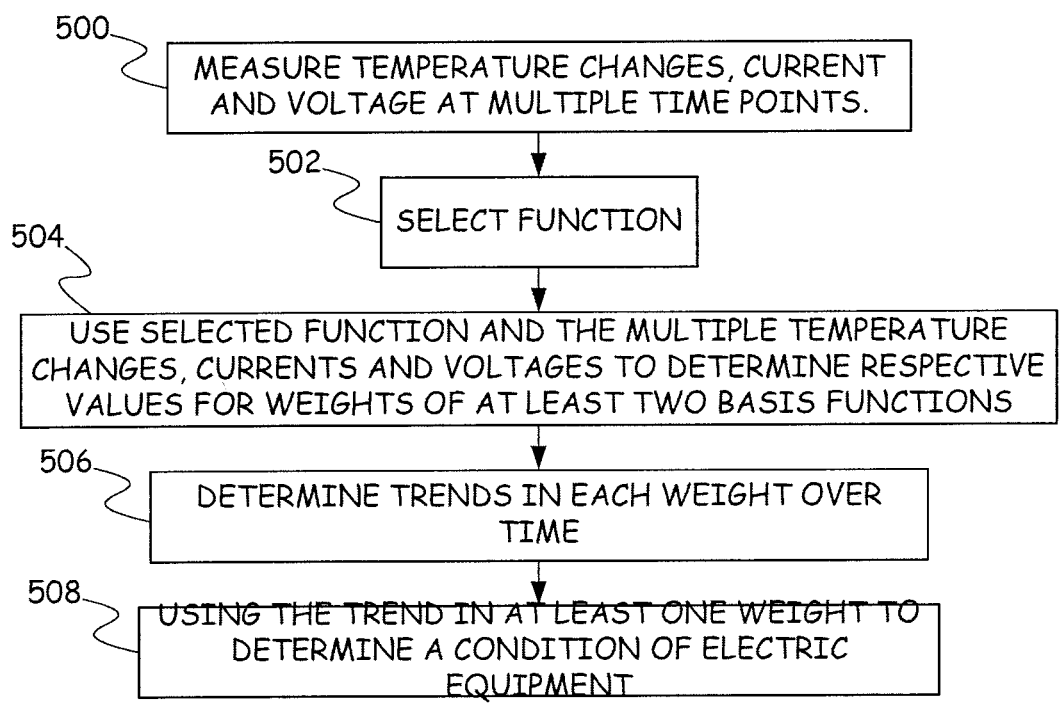
FIG. 5 provides a flow diagram of a method of identifying and trending state variables to determine the health of an electric asset.

FIG. 5 provides a flow diagram of a method of identifying trends in such state variables. In step 500, temperatures and loads on conductive path/electric asset 400 are measured at different time points. For example, for each time point, temperature sensors 426 and 430 are used to measure the temperature on conductive path 400 and the ambient temperature of the air around the conductive path, $T_A$. A measured temperature change, $\Delta T_{meas}$, is then set as the difference between the conductive path temperature and the ambient temperature for the time point. In addition, current sensor 402 measures the load current and voltage sensor 406 measures the load voltage on conductive path/electric asset 400 for each time point. In accordance with one embodiment, the multiple time points span at least a period of cyclic variations in the current.

At step 502, a function describing the relationship between two or more basis functions and the temperature change is selected. For example, if the ohmic basis function is to be evaluated, the function is selected from one of the following functions:

$$\Delta T = F(V, <Vi>, I, \ldots) \sim <r> r(I, \ldots) + <g> g(V, \ldots) + <p> p(V, <V_i> \ldots) + \text{remainder}(I, V, \ldots) \quad \text{EQUATION 45}$$

$$\Delta T = F(V, <Vi>, I, \ldots) \sim <r> r(I, \ldots) + <p> p(V, <V_i> \ldots) + \text{remainder}(I, V, \ldots) \quad \text{EQUATION 46}$$

$$\Delta T = F(V, I, \ldots) \sim <r> r(I, \ldots) + <g> g(V, \ldots) + \text{remainder}(I, V, \ldots) \quad \text{EQUATION 47}$$

$$\Delta T = F(V, I, \ldots) \sim <r> r(I, \ldots) + \text{remainder}(I, V, \ldots) \quad \text{EQUATION 48}$$

where the basis functions can take any form including those of Equations 2, 3, 5, 6, 9-12, and 28-30, for example, and each remainder accounts for heat sources and heat losses that are not explicitly or completely represented by a basis function. Similar equations will be obvious by analogy for evaluating the voltage or partial discharge basis functions.

The selection of the function may be explicit by selecting between two or more functions stored in memory 422 or implicit by using the only function stored in memory 422.

At step 504, the measured values for the load current, load voltage, temperature change and ambient temperature for multiple time points are used to determine values for the weights/state variables of the selected function such as <r>, <p>, <g> and <V_i>. For example, in one embodiment the values for <r> and <g> are determined from equation 46 by taking the partial derivatives of the function with respect to I and V. The change in $\Delta T_{meas}$ for a change in I between time points is then used with the partial derivative with respect to I evaluated at one or more of the time points to determine the value for <r> and the change in $\Delta T_{meas}$ for a change in V between time points is used with the partial derivative with respect to V evaluated at one or more of the time points to determine the value for <g>. Those skilled in the art will recognize that other numerical methods can be used to determine <r> and <g> from the data collected for the time points. The values of the weights/state variables are determined at multiple different time points.

At step 506, trends in the weights/state variables are identified with respect to base values. In accordance with one embodiment, such trending filters slow variations in the weights/state variables and highlights rapid changes in the weights/state variables. For example, the trending can use an exponential forgetting function such that a present average of a weight/state variable is more heavily dependent upon more recent values of the weight/state variable than upon past values.

At step 508, the trended weight/state variable is used to determine the health of conductive path/electric asset 400. For example, when the trended weight/state variable begins to diverge from a base value, the health of conductive path/electric asset 400 is determined to be declining and an alert is sent through output channel 424. For example, a rise in the value of <r> can indicate a poor connection between conductive path/electric asset 400 and neighboring equipment while an increase in <g> indicates increased conductance through the insulator, an increase in <p> indicates an increase in partial discharge, and a decrease in <V_i> indicates an increase in partial discharge.

Figure 6:
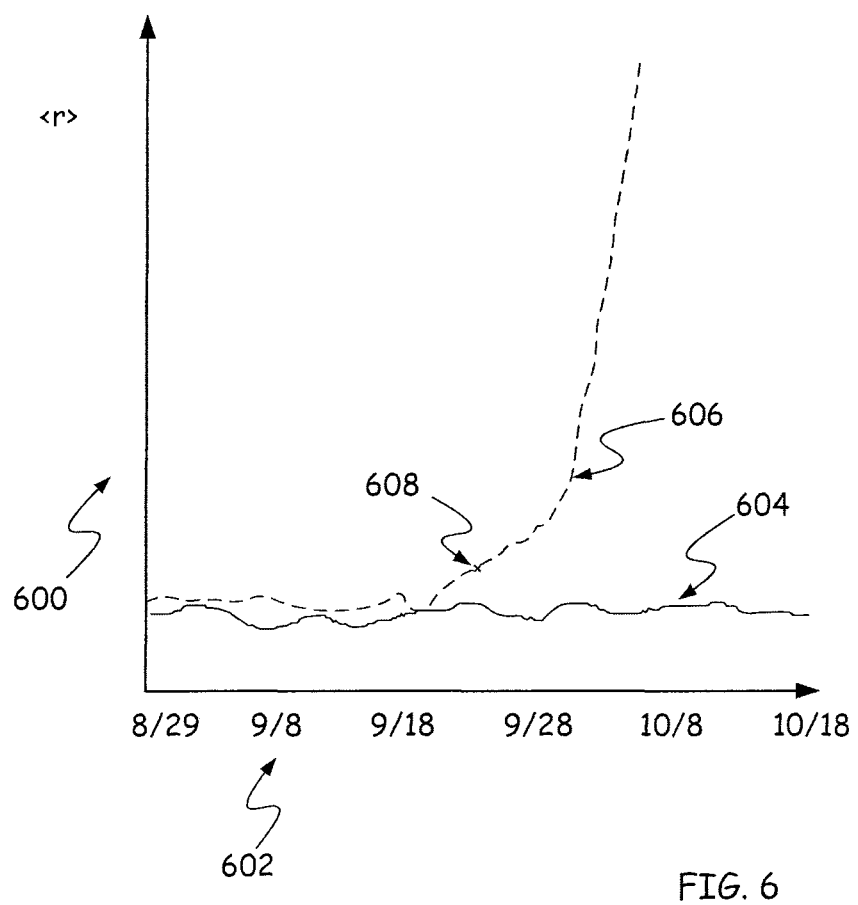
FIG. 6 provides a graph showing trending<r> values for a healthy electric asset and a damaged electric asset.

FIG. 6 shows graphs of <r> as a function of time for two different electric assets. In FIG. 6, values of <r> are shown along vertical axis 600 and time is shown along horizontal axis 602. Graph 604 of FIG. 6 shows the value of <r> for an electric asset that is functioning properly, and graph 606 shows the value of <r> for an electric asset that was functioning properly until time point 608 when <r> began to diverge from its base value, likely due to a loose connection. Microprocessor 420, identifies this divergence in the trend of <r> in the various embodiments and sends an alert at time 608, allowing the electric asset to be repaired before further damage can occur.

Figure 7:
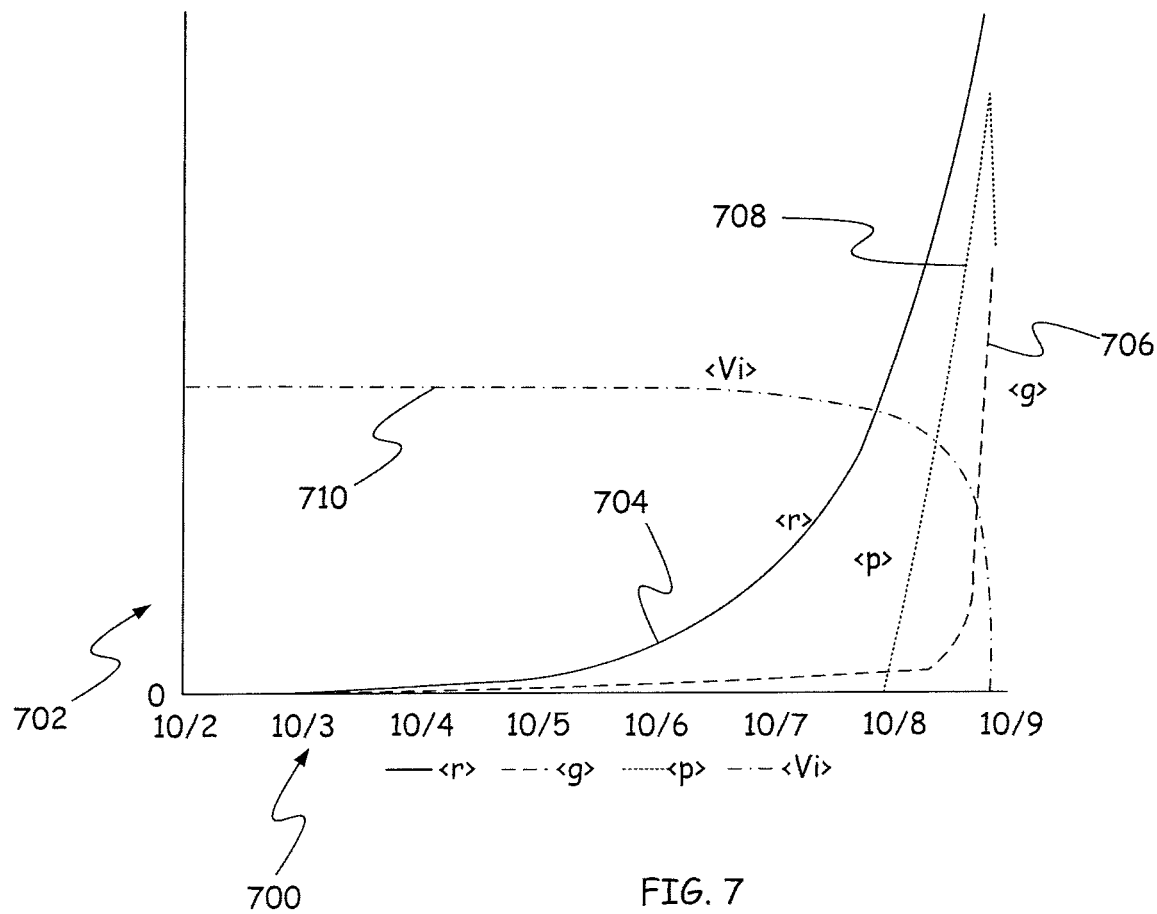
FIG. 7 shows graphs of various trended state variables for a collection of failure modes for electric assets.

FIG. 7 shows graphs for <r>, <g>, <p>, and <V_i> for various failure modes of electric assets. In FIG. 7, time is shown along horizontal axis 700 and the values for the various state variables <r>, <g>, <p>, and <V_i> are shown along vertical axis 702. Graph 704 shows a change in <r> due to an increase in resistance of the conductor of the asset such as due to a loose connection or corroded connection. Graph 706 shows a change in <g> due to an increase in the insulator conductance such as due to a deterioration of the insulator. Graphs 708 and 710 show increases in <p> and decreases in <Vi>, which will occur with increases in partial discharge along the electric asset.

The various embodiments therefore offer:

1) The ability to account for nonlinear relationships by learning from past correlations. The incorporation of these effects improves the accuracy of real time estimates of load capability.

2) A means of predictive analytics to forecast remaining life of an electric asset. While short term load estimations are useful in determining dynamic limits on loads, they are not monotonic and do not provide an easily trended variable for predictive analytics.

The preceding discussions have related to aspects and embodiments of a method to use multivariate basis functions to extract trendable values representing physical aspects of machine health in an electric power asset. These values offer stable state variables that are compensated for line voltage, load current, and optionally additional measured operational parameters.

In one aspect, an improved method for determining the their rally limited load current is provided.

In another aspect, an improved method for determining a rated-current limited temperature is provided.

In another aspect, a method for determining the thermally limited line voltage is provided.

In another aspect of the invention, a load-independent "dynamic resistance" is extracted from the temperature-current curve, offering an improvement over trending temperature.

In other aspects, additional state variables, predictive to the assets remaining time to failure are provided.

Exemplary basis functions for the state variable deconvolution are given. The examples given are illustrative and not limiting and there are any number of variations of the basis functions that could be used. The proposed invention claims the benefit of any such expanded basis function, including the introduction of additional non-linearity and environmental dependence.

The discussions, above, include various model parameters. In some implementations, only a subset of the model parameters may be used. In others, additional terms, now obvious in light of the present invention, may be added without deviating from the present invention.

In some implementations, the model parameters would be determined by engineering methods including prediction, measurement, and curve-fitting. In other implementations, an automated system based on machine learning could optimize the model parameters for minimum values of a fitting function based on historical data.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above.

What is claimed is:

1. A method for determining a dynamic rating for a load parameter along a conductive path, the method comprising:
   using a sensor to measure a value for the load parameter;
   selecting a heating process associated with the load parameter;
   modifying a rated temperature change for the conductive path by removing temperature changes due to a heating process other than the selected heating process to produce an impaired rated temperature change;
   determining a thermal load percentage as a ratio of a temperature change due to the selected heating process over the impaired rated temperature change; and
   using the thermal load percentage and the measured value for the load parameter to dynamically determine the dynamic rating for the load parameter.

2. The method of claim 1 wherein determining the thermal load percentage further comprises determining the temperature change due to the selected heating process by subtracting a temperature change due to the heating process other than the selected heating process from a measured temperature change.

3. The method of claim 2 wherein the measured temperature change is measured by measuring an ambient temperature, measuring a temperature of the conductive path and subtracting the measured ambient temperature from the measured temperature of the conductive path.

4. The method of claim 3 wherein measuring the ambient temperature comprises making a plurality of temperature measurements of at least one conductive path under different load conditions and taking a lowest measured temperature from the plurality of temperature measurements as the measured ambient temperature.

5. The method of claim 1 wherein determining the dynamic rating for the load parameter comprises performing an inverse of a function on the thermal load percentage to form a load parameter percentage and dividing the measured value by the load parameter percentage to obtain the dynamic rating for the load parameter.

6. The method of claim 5 wherein performing an inverse of a function comprises taking a square root of the thermal load percentage.

7. The method of claim 5 wherein performing an inverse of a function comprises performing an inverse that is different from a square root.

8. The method of claim 1 wherein the load parameter comprises a current on the conductive path.

9. The method of claim 8 wherein removing temperature changes due to a heating process other than the selected heating process comprises removing temperature changes due to conductance through an insulator.

10. The method of claim 9 wherein removing temperature changes due to a heating process other than the selected heating process further comprises removing temperature changes due to partial discharge.

11. The method of claim 8 wherein removing temperature changes due to a heating process other than the selected heating process comprises removing temperature changes due to partial discharge.

12. The method of claim 1 wherein the load parameter comprises a voltage across an insulator.

13. The method of claim 12 wherein removing temperature changes due to a heating process other than the selected heating process comprises removing temperature changes due to ohmic current through the conductive path.

14. The method of claim 13 further comprising further modifying a rated temperature change for the conductive path by removing temperature changes due to partial discharge.

15. The method of claim 12 wherein using the thermal load percentage and the measured value to dynamically determine the dynamic rating for the load parameter comprises performing an inverse of a function on the thermal load percentage to form a load parameter percentage and dividing the measured value by the load parameter percentage to obtain a result and selecting the smaller of the result and a partial discharge inception voltage as the dynamic rating for the load parameter.

16. The method of claim 1 wherein removing temperature changes due to a heating process other than the selected heating process comprises applying a second load parameter to a basis function to produce a basis function result and multiplying the basis function result by a state variable.

17. The method of claim 16 wherein the basis function comprises:

$$I^2(1+c(T_A+\Delta T))/(a+b\Delta T/T_A)$$

where I is current on the conductive path, $T_A$ is an ambient temperature, $\Delta T$ is a difference between a temperature of the conductive path and the ambient temperature, and a, b and c are model parameters that account for nonlinearity of the basis function.

18. The method of claim 16 wherein the basis function comprises:

$$V^2(1+dH)(1+c(T_A+\Delta T))/(a+b\Delta T/T_A)$$

where V is the voltage on the conductive path, $T_A$ is an ambient temperature, $\Delta T$ is a difference between a temperature of the conductive path and the ambient temperature, a, b, c and d are model parameters that account for nonlinearity of the basis function, and H is the relative humidity.

19. The method of claim 16 wherein the basis function comprises:

$$(a*PD^c+b*SD^d)V/(e+f\Delta T/T_A)$$

where PD is an externally measured partial discharge intensity, SD is an externally measured corona discharge intensity, V is a voltage on the conductive path, $T_A$ is an ambient temperature, $\Delta T$ is a difference between a temperature of the conductive path and the ambient temperature and a, b, c, d, e are parameters of the basis function.

20. The method of claim 16 wherein the basis function comprises:

$$fV<Q><N>$$

where f is the frequency of voltage V on the conductive path, <Q> is the peak charge associated with partial discharge events, and <N> is a repetition number representing a number of partial discharge events per cycle of voltage V.

* * * * *